US005250763A

United States Patent [19]

Brown

[11] Patent Number: 5,250,763

[45] Date of Patent: Oct. 5, 1993

[54] ACOUSTICAL EQUALIZATION DEVICE SYSTEM

[76] Inventor: William G. Brown, P.O. Box 102, Bridgeport, N.Y. 13030

[21] Appl. No.: 34,796

[22] Filed: Mar. 3, 1993

Related U.S. Application Data

[63] Continuation of Ser. No. 772,570, Oct. 7, 1991, abandoned.

[51] Int. Cl.[5] .............................................. H05K 5/00

[52] U.S. Cl. .................................... 181/155; 181/295; 181/30

[58] Field of Search ................................ 181/148-155, 181/191, 199, 287, 292, 293, 295, 30; 381/90, 160, 158

[56] References Cited

U.S. PATENT DOCUMENTS 2,656,004 10/1953 Olson ............................ 181/155 X
3,382,947 5/1968 Biggs .................................. 181/30
3,862,366 1/1975 Huszty et al. ......................... 381/90
4,682,670 7/1987 Lerner et al. .................. 181/295 X
4,701,951 10/1987 Kash .............................. 181/155 X
5,031,220 7/1991 Takagi ........................... 181/155 X

FOREIGN PATENT DOCUMENTS 0036699 2/1988 Japan .................................. 381/160

*Primary Examiner*—Michael L. Gellner
*Assistant Examiner*—Khanh Dang
*Attorney, Agent, or Firm*—S. Michael Bender

[57] ABSTRACT

An acoustical equalization device is designed to be attached to the front of a stereo speaker and includes a plurality of moveable baffles which may be used to either reflect or absorb sound waves being emitted from the speaker. The baffles can be slidably positioned along a plurality of rods forming a part of the device and may be pivoted into a desired sound adjusting position. Modified baffles include through-extending apertures into which sound modifying cones may be removably positioned, while the cones may be provided with pivotal closures to further affect sound quality. The device is used as an aid in equalizing a sound system so as to obtain the best audio response curve without the use of electronic equalization systems.

6 Claims, 4 Drawing Sheets

ACOUSTICAL EQUALIZATION DEVICE SYSTEM

This application is a continuation of application Ser. No. 07/772,570, filed Oct. 7, 1991, now abandoned.

BACKGROUND OF THE INVENTION

1. Field of the Invention

The present invention relates to speaker systems and more particularly pertains to a sound modifying system which may be mounted over the front of a speaker to effectively vary an audio response curve.

2. Description of the Prior Art

The use of electronic circuits to operably equalize a stereo sound system is known in the prior art. More particularly, an oscilloscope or some other sound measuring device can be used to display an audio response curve so as to achieve a high sound quality.

As can be appreciated, all present known means of controlling sound quality in this manner are through the use of electronic circuits and once a stereo system has been purchased, it is difficult to later modify a speaker system through the implementation of such electronics. As such, there exists a continuing need for some means of adjusting sound quality within a stereo speaker system without the use of electronic devices and in this respect, the present invention substantially fulfills this need.

SUMMARY OF THE INVENTION

In view of the foregoing disadvantages inherent in the known types of sound equalization devices now present in the prior art, the present invention provides an improved sound equalizing device construction wherein the same utilizes no electronics and can be removably attached in front of an existing stereo speaker. As such, the general purpose of the present invention, which will be described subsequently in greater detail, is to provide a new and improved sound equalizing device which has all the advantages of the prior art sound equalizing devices and none of the disadvantages.

To attain this, the present invention essentially comprises an acoustical equalization device which is designed to be attached to the front of a stereo speaker and includes a plurality of moveable baffles which may be used to either reflect or absorb sound waves being emitted from the speaker. The baffles can be slidably positioned along a plurality of rods forming a part of the device and may be pivoted into a desired sound adjusting position. Modified baffles include through-extending apertures into which sound modifying cones may be removably positioned, while the cones may be provided with pivotal closures to further affect sound quality. The device is used as an aid in equalizing a sound system so as to obtain the best audio response curve without the use of electronic equalization systems.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved acoustical equalization device which has all the advantages of the prior art acoustical equalization devices and none of the disadvantages.

It is another object of the present invention to provide a new and improved acoustical equalization device which may be easily and efficiently manufactured and marketed.

It is a further object of the present invention to provide a new and improved acoustical equalization device which is of a durable and reliable construction.

An even further object of the present invention is to provide a new and improved acoustical equalization device which is susceptible of a low cost of manufacture with regard to both materials and labor, and which accordingly is then susceptible of low prices of sale to the consuming public, thereby making such acoustical equalization devices economically available to the buying public.

Still yet another object of the present invention is to provide a new and improved acoustical equalization device which provides in the apparatuses and methods of the prior art some of the advantages thereof, while simultaneously overcoming some of the disadvantages normally associated therewith.

Still another object of the present invention is to provide a new and improved acoustical equalization device which can be removably attached to the front of an existing stereo speaker.

Yet another object of the present invention is to provide a new and improved acoustical equalization device which eliminates the need for complex electronic circuitry.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
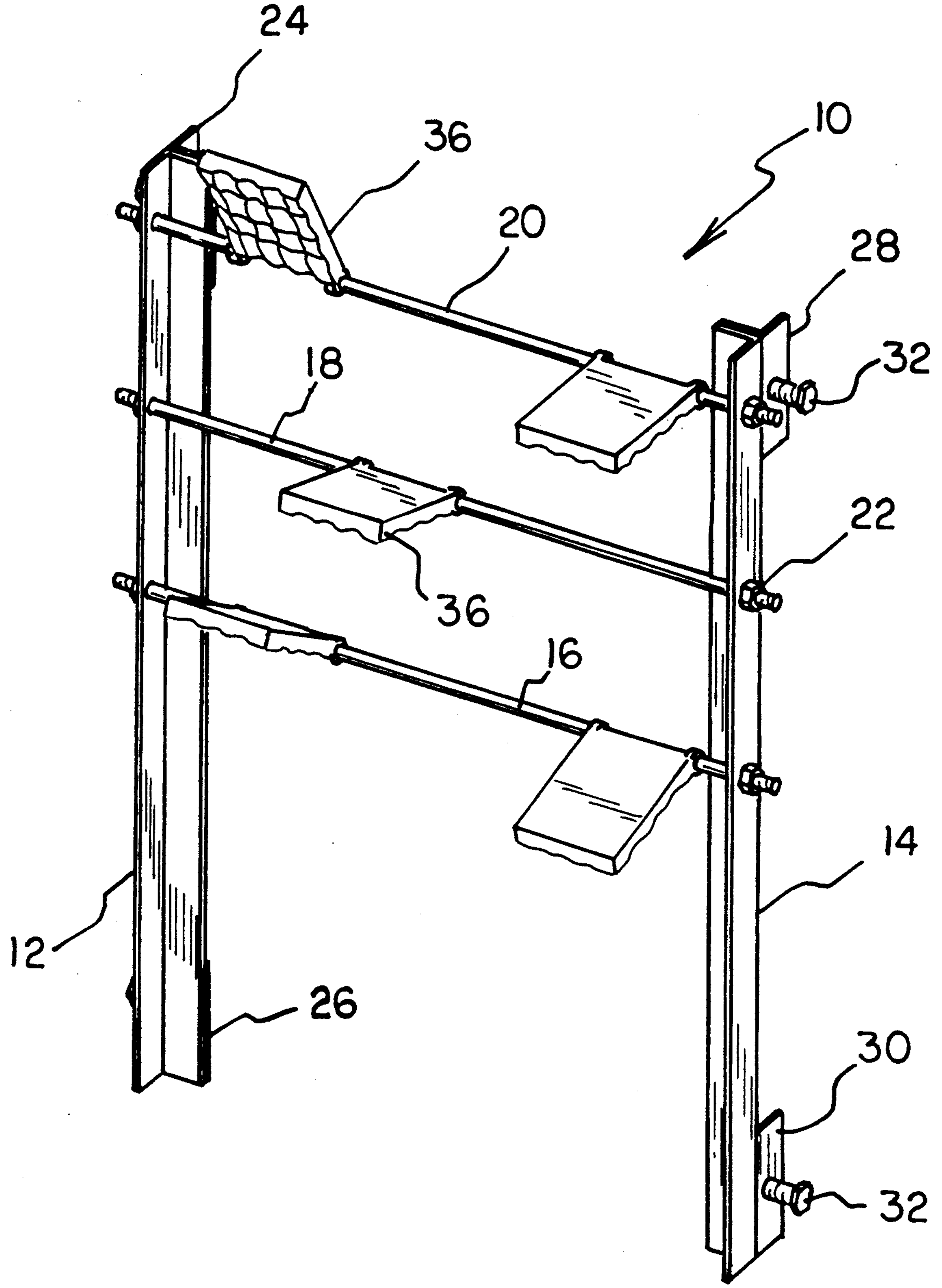
FIG. 1 is a perspective view of the acoustical equalization device comprising the present invention.

With reference now to the drawings, and in particular to FIG. 1 thereof, a new and improved acoustical equalization device embodying the principles and concepts of the present invention and generally designated by the reference numeral 10 will be described.

Figure 2:
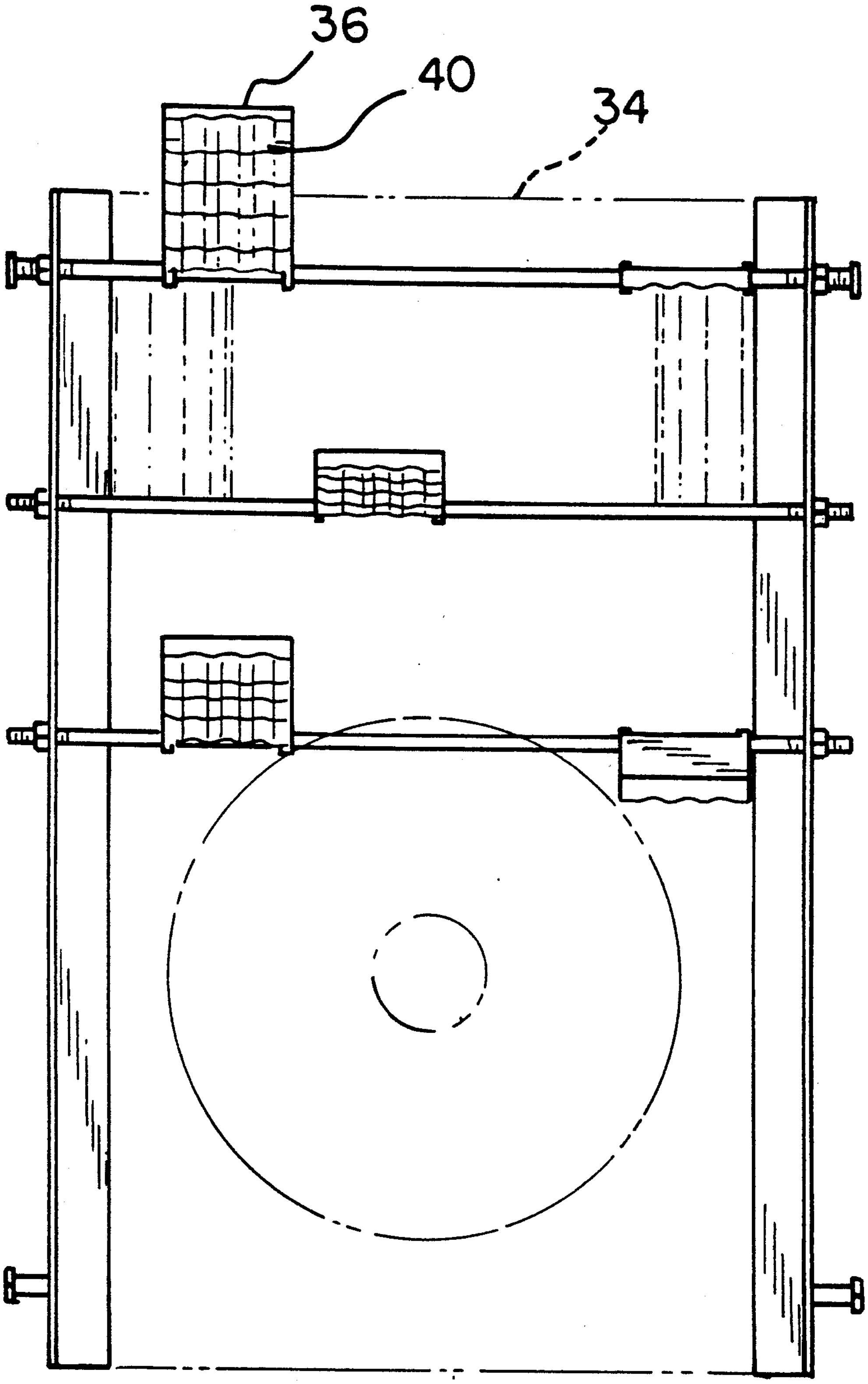
FIG. 2 is a front elevation view of the invention showing the same operably attached to an existing stereo speaker.
Figure 3:
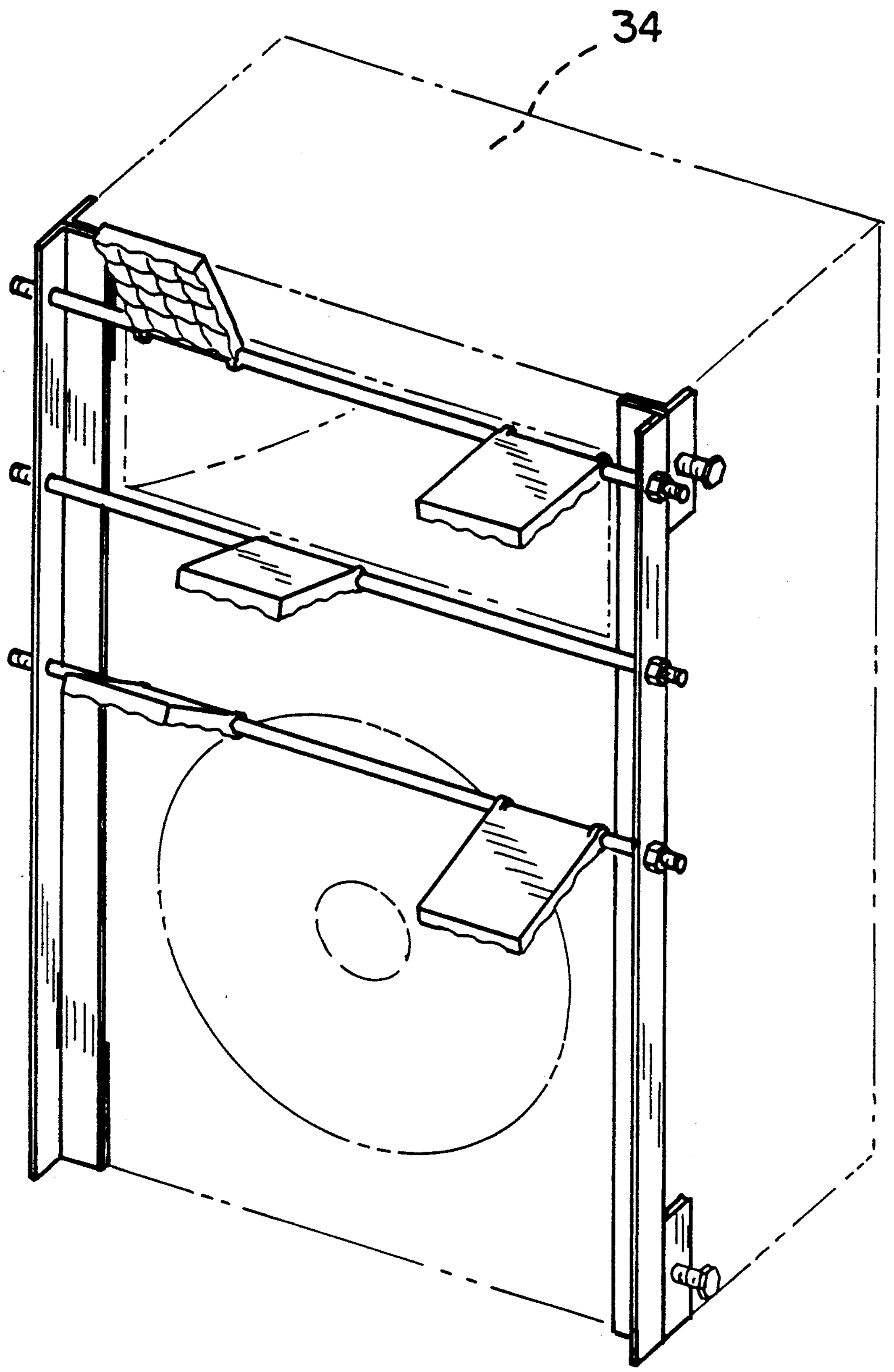
FIG. 3 is a perspective view of the invention attached to a speaker.

More specifically, it will be seen that the acoustical equalization device 10 essentially comprises a pair of upstanding supports 12, 14 which are paralleledly aligned and which are joined together by a plurality of cross extending rods 16, 18, 20. The rods 16, 18, 20 have threaded ends whereby a plurality of threaded fasteners 22 can be utilized to control the adjustable positioning of the supports 12, 14 in a spaced-apart relationship. The supports 12, 14 in a preferred embodiment would consist of angle iron or some similar material. The support 12 has a pair of angle connectors 24, 26 fixedly secured to opposite ends thereof, while the support 14 has a similar pair of connectors 28, 30 fixedly secured to opposite ends. Threaded fasteners 32 are directed through each of the connectors 24, 26, 28, 30 to facilitate an attachment of the device 10 to an existing stereo speaker 34 as shown in FIGS. 2 and 3.

Attached to each of the cross-extending rods 16, 18, 20 are a plurality of slidably movable, pivotally adjustable baffles 36. The baffles 36 are frictionally retained on the rods 16, 18, 20 and are designed to either reflect or absorb sound waves depending upon the material utilized. As clearly shown in FIGS. 1-3, the baffles 36 may include one smooth side 38 for reflecting soundwaves and an ungulated surface 40 designed to scatter or absorb sound waves.

In use, the acoustical equalization device 10 may be attached to the front of a speaker 34 in a manner whereby the baffles may be slidably adjustably positioned in front of the speaker system. Through the use of an oscilloscope or some other sound measuring device, the acoustical response curve can be selectively adjusted by moving the baffles 36 to various positions. If it becomes desirable to effect a reflection of sound waves, a baffle 36 may be rotated upwardly on one of the rods 16, 18, 20 whereby a smooth reflective surface 38 is positioned in front of the emitted sound. If it becomes more desirable to absorb sound waves, a baffle 36 may be rotated downwardly on one of the rods 16, 18, 20 to effectively position the sound absorbing surface 40 in front of an emitted sound wave. The acoustical equalization device 10 may be permanently attached to a speaker 34 through a use of the threaded fasteners 32 in a now apparent manner.

Figure 4:
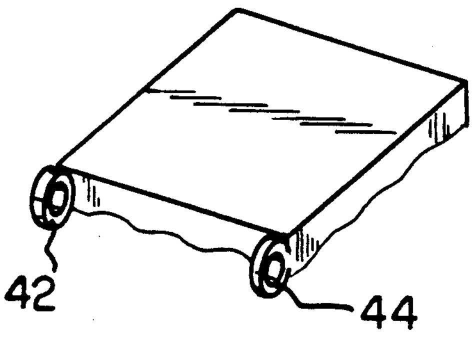
FIG. 4 is a perspective view of a sound attenuating baffle forming a part of the present invention.

Recognizing that the baffles 36 are the most important feature of the present invention, reference is made to FIG. 4 of the drawings where it can be seen that a plurality of baffles can be mounted to any one of the rods 16, 18, 20 through the use of integrally attached rings 42, 44 mounted on one end of a baffle. The rings 42, 44 are designed to frictionally grip a particular rod 16, 18, 20 to thus effect a slidable pivotal mounting of a particular baffle 36 thereon, while it is also envisioned that any number of rods could be utilized between the upstanding supports 12, 14. As such, the depiction of only three rods 16, 18, 20 is not intended to be limiting with respect to the most economically and efficient design of the invention.

Figure 5:
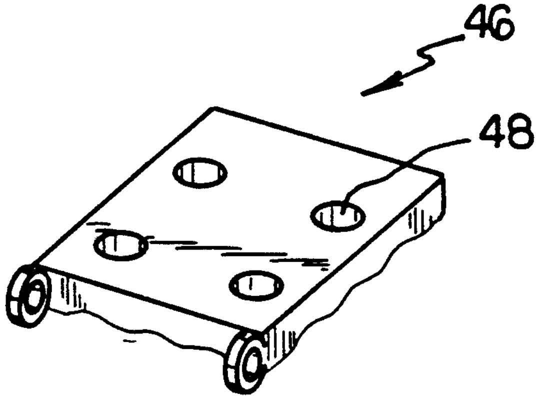
FIG. 5 is a perspective view of a modified baffle.
Figure 6:
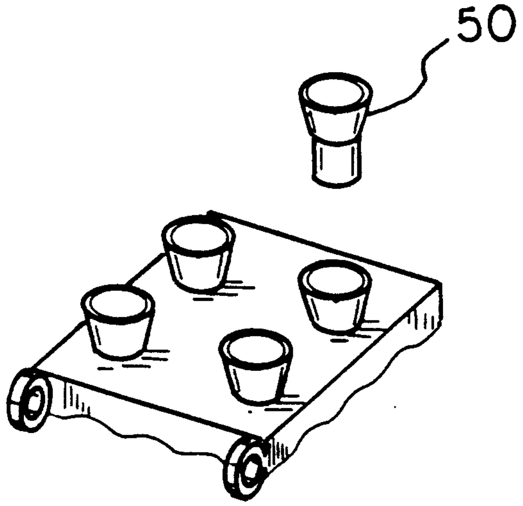
FIG. 6 is a perspective view of a further baffle embodiment.
Figure 7:
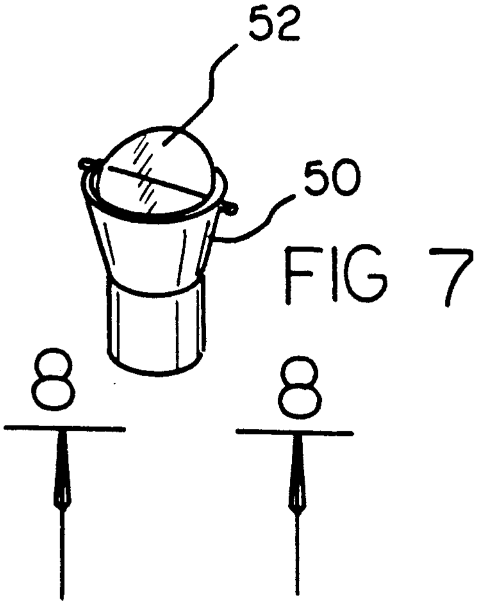
FIG. 7 is a perspective view of a sound affecting cone which may be operably attached to a baffle.
Figure 8:
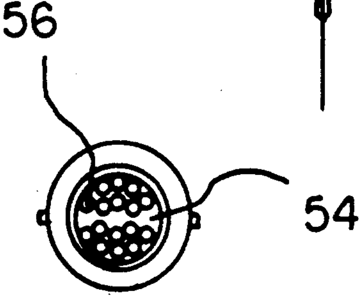
FIG. 8 is an end elevation view of a cone as viewed along the line 8—8 in FIG. 7.

FIG. 5 of the drawings illustrates a modified embodiment of a baffle wherein such a modified embodiment is generally designated by the reference numeral 46. In this embodiment 46, a plurality of through-extending aperture 48 are drilled through a baffle to further effect sound attenuation. The number of apertures 48 can be varied to affect sound in a myriad of different ways, and FIG. 6 illustrates a further embodiment wherein removable sound magnifying cones 50 are positionable in each of the apertures 48. The cones 50 receive and direct sound waves outwardly in the manner of a megaphone, and the cones may be further modified to provide for a much more fine adjustment of sound waves as shown in FIG. 7 and 8. In this respect, a cone 50 may also be provided with a manually pivotable closure 52 and a bottom plate 54 through which a plurality of small apertures 56 are directed. All of these features combined to effect sound in a variety of different ways so as to allow a user to obtain the best audio response curve available.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by LETTERS PATENT of the United States is as follows:

1. A new and improved acoustical equalization device comprising:

a frame structure attachable in front of an existing stereo speaker;

at least one cross-extending rod forming a part of said frame structure and positionable in front of said speaker; and at least one pivotally mounted, slidably positionable baffle attached to said cross-extending rod wherein said baffle has one surface designed to reflect sound waves and an opposed surface designed to absorb sound waves, further including at least one aperture directed through said baffle and a removable cone positionable in said aperture.

2. The new and improved acoustical equalization device as described in claim 1, and further including a manually operable closure attached to an open end of said cone.

3. The new and improved acoustical equalization device as described in claim 2, and further including a perforated plate formed in an end of said cone.

4. A new and improved acoustical equalization device comprising:

support means adapted to be positioned in relation to a sound source so as to intercept acoustical the signature radiated by said sound source, a multiplicity of discrete baffles, each of said baffles comprising a substantially flat plate having opposed surfaces of differing acoustical characteristics, one of said surfaces being sound absorbent and the other opposed surface being sound reflective, said plate having a mounting edge forming a portion of the peripheral extent thereof, means for pivotally mounting said baffle plates on said support means, said mounting means being located on said mounting edge and defining an axis of rotation for said plate relative to said support means, said mounting means further including means for permitting slidable movement of said plate mounting edge along said support means in the direction of said axis, and means cooperating with said mounting means for maintaining each baffle plate in an adjusted pivotal and axial orientation relative to said support means, said sound source and each other whereby desired equalization of the acoustical signature radiated from said sound source may be effected.

5. The acoustical equalization device of claim 4 wherein one or more of said baffle plates includes one or more apertures extending between said opposed surfaces.

6. The acoustical equalization device of claim 4 wherein said support means comprises a pair of upright support members, at least one cross-extending member attached between said support members, bracket means attached to each of said support means and extending rearwardly therefrom, said sound source comprising a stereo speaker supported on one side of an enclosure, said brackets having fastener means for attachment to said enclosure with said upright support members being located proximal to said one side of said enclosure and said cross-extending member intercepting the sound radiated from said speaker, said baffle mounting means being affixed to said cross-extending member between said substantially flat plate mounting edge and said cross-extending member and said substantially flat plate extends radially from said axis and said cross-member whereby said baffle plates are pivotally positionable about said cross-extending member and slidably positionable along said cross-extending member to intercept sound emanating from said speaker and said means cooperating with said mounting means is adapted to maintain each said baffle plate in a desired pivotal orientation os said cross-extending member.

* * * * *